(12) United States Patent
Oh et al.

(10) Patent No.: US 9,704,601 B2
(45) Date of Patent: Jul. 11, 2017

(54) METHOD FOR REPAIRING DEFECTIVE MEMORY CELLS IN SEMICONDUCTOR MEMORY DEVICE

(71) Applicant: Samsung Electronics Co., Ltd., Suwon-si (KR)

(72) Inventors: Ji-Hyuk Oh, Seoul (KR); Ki-Seok Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 24 days.

(21) Appl. No.: 14/740,457

(22) Filed: Jun. 16, 2015

(65) Prior Publication Data

US 2016/0062819 A1   Mar. 3, 2016

(30) Foreign Application Priority Data

Sep. 1, 2014  (KR) .......................... 10-2014-0115453

(51) Int. Cl.
| | |
|---|---|
| *G11C 29/00* | (2006.01) |
| *G11C 29/44* | (2006.01) |
| *G06F 11/10* | (2006.01) |
| *G11C 29/04* | (2006.01) |

(52) U.S. Cl.
CPC .......... *G11C 29/70* (2013.01); *G06F 11/1048* (2013.01); *G11C 29/4401* (2013.01); *G11C 2029/0409* (2013.01)

(58) Field of Classification Search
CPC .......... G06F 11/10; G06F 11/08; G06F 11/14; G06F 11/07; G06F 11/108; G06F 12/0246; G06F 11/1048; G06F 11/1666; G06F 11/1004; G06F 11/1008; G06F 11/2284; G11C 29/00; G11C 29/08; G11C 2029/0411; G11C 29/765; G11C 29/70; G11C 29/4401; G11C 2029/0409; G11C 2029/0407; G11C 29/44; G11C 2029/1208; G11C 2029/1806; G11C 2029/4402; G11C 2029/5606
USPC ......................................... 714/710, 718, 723
See application file for complete search history.

(56) References Cited

U.S. PATENT DOCUMENTS

| | | | |
|---|---|---|---|
| 5,793,943 A * | 8/1998 | Noll ..................... | G06F 11/1417 714/11 |
| 6,154,851 A | 11/2000 | Sher et al. | |
| 6,625,730 B1 | 9/2003 | Angelo et al. | |
| 7,359,243 B2 | 4/2008 | Ha | |
| 7,752,495 B2 | 7/2010 | Zorek, Sr. et al. | |

(Continued)

FOREIGN PATENT DOCUMENTS

WO   WO 2015133982 A1 * 9/2015 .......... G06F 11/1048

*Primary Examiner* — Cynthia Britt
(74) *Attorney, Agent, or Firm* — Muir Patent Law, PLLC

(57) ABSTRACT

Provided is a method for repairing one or more defective memory cells of a semiconductor memory device by a system management interrupt and a basic input/output system service routine. In the method, when an error has occurred in data read from the semiconductor memory device, the system management interrupt is generated to invoke the basic input/output system service routine. During execution of the basic input/output system service routine, a repair task is performed to one or more defective memory cells causing a read error in the semiconductor memory device using spare memory cells.

8 Claims, 15 Drawing Sheets

(56) References Cited

U.S. PATENT DOCUMENTS

| | | |
|---|---|---|
| 7,797,583 B2 | 9/2010 | Co |
| 7,870,435 B2 | 1/2011 | Blodgett |
| 8,015,438 B2 * | 9/2011 | Bruennert .............. G11C 29/44 714/42 |
| 8,103,908 B2 | 1/2012 | Rothman et al. |
| 8,255,594 B2 | 8/2012 | De et al. |
| 8,516,298 B2 * | 8/2013 | Lu ....................... G06F 11/1666 714/2 |
| 8,612,800 B2 | 12/2013 | Hendricks et al. |
| 8,645,811 B2 | 2/2014 | Sauber et al. |
| 8,689,041 B2 * | 4/2014 | Lu ....................... G06F 11/1666 714/6.13 |
| 2008/0052721 A1 * | 2/2008 | Rangarajan ........... G06F 9/5016 718/105 |
| 2008/0195893 A1 | 8/2008 | Lee et al. |
| 2009/0049257 A1 * | 2/2009 | Khatri ..................... G11C 5/04 711/161 |
| 2009/0161431 A1 * | 6/2009 | Hsiao ..................... G11C 29/44 365/185.09 |
| 2012/0023364 A1 | 1/2012 | Swanson et al. |
| 2013/0227342 A1 | 8/2013 | Shepherd |

* cited by examiner

METHOD FOR REPAIRING DEFECTIVE MEMORY CELLS IN SEMICONDUCTOR MEMORY DEVICE

CROSS-REFERENCE TO RELATED APPLICATIONS

This US non-provisional patent application claims priority under 35 USC §119 to Korean Patent Application No. 10-2014-0115453, filed on Sep. 1, 2014, the disclosure of which is incorporated by reference in its entirety herein.

BACKGROUND

Technical Field

Embodiments of the present disclosure relate to semiconductor memory devices and data processing systems and, more particularly, to a method for repairing defective memory cells of a semiconductor memory device.

Discussion of Related Art

A data processing system including a processor may use a main memory such as a dynamic random access memory (DRAM) as a working memory.

A DRAM module including a plurality of DRAMs is controlled by a memory controller that receives a request from a processor to perform a memory control operation.

A DRAM may include a memory cell that includes a single access transistor and a single storage capacitor. When it is difficult to properly retain data stored in a certain memory cell, the memory cell may become a defective memory cell. The defective memory cell refers to a memory cell that causes a read error irrespective of hard failure or soft failure.

A defective memory cell hard-failed during manufacturing of a DRAM is typically repaired using a spare memory cell in a redundancy memory area. Repair units may include various units such as cell-to-cell, row-to-row, column-to-column, and block-to-block.

After shipment of a dynamic random access memory (DRAM) and during its operation, a weak memory cell may lose its stored data before a refresh period arrives. A memory cell failed during the operation of the DRAM may result in a read error, i.e., stored data cannot be read normally.

Although an ECC engine may be adapted in a memory controller to correct a read error, there is a limitation in correction using the ECC engine. Accordingly, there is a need for effectively repairing a defective memory cell causing a read error continuously or frequently on a board during the operation of a data processing system.

SUMMARY OF THE INVENTION

Embodiments of the present disclosure provide methods for repairing defective memory cells of a semiconductor memory device.

According to an aspect of the inventive concept, a method for repairing one or more defective memory cells of a semiconductor memory device may include checking whether an error has occurred in data read from the semiconductor memory device; generating a system management interrupt to invoke a basic input/output system service routine when it is determined that the error has occurred in the read data; and performing a repair task to repair one or more defective memory cells causing a read error in the semiconductor memory device by using spare memory cells during execution of the basic input/output system service routine.

In some embodiments, checking whether an error has occurred may be performed based on a result from an operation of an error correction code (ECC) engine.

In some embodiments, the repair task may include an operation of checking and storing defective cell information of the defective memory cells causing the read error in the semiconductor memory device.

In some embodiments, storing the defective cell information may be performed through a defective cell information storage unit which stores the defective cell information as binary data.

In some embodiments, the repair task may include checking defective cell information corresponding to the one or more defective memory cells; and repairing the one or more defective memory cells using the one or more spare memory cells based on the defective cell information when the BIOS service routine is executed during a time period of an operating system mode for a system.

In some embodiments, repairing the one or more defective memory cells corresponds to at least one of a plurality of rows of memory cells.

In some embodiments, repairing the one or more defective memory cells corresponds to at least one of a plurality of columns of memory cells.

In some embodiments, the basic input/output system service routine may be executed according to a program stored in a basic input/output system memory.

In some embodiments, the semiconductor memory device may be a dynamic random access memory (DRAM) including a spare memory cell array, and the system management interrupt may be generated by a memory controller electrically coupled to the DRAM.

In some embodiments, the memory controller may control the DRAM for executing the repair operation.

According to another aspect of the inventive concept, a method for repairing one or more defective memory cells of a semiconductor memory device may include checking whether an error has occurred in data read from the semiconductor memory device; generating a system management interrupt to invoke a basic input/output system service routine when the error has occurred in the read data; checking and storing defective cell information corresponding to the one or more defective memory cells causing a read error in the semiconductor memory device during an execution of the basic input/output system service routine; reading the defective cell information during a power-on self test (POST) of a basic input/output system when a system is rebooted; and performing a repair operation to repair the one or more defective memory cells using one or more spare memory cells of the semiconductor memory device, based on the defective cell information, before an operating system is loaded.

In some embodiments, checking whether the error has occurred may be performed based on a result from an operation of an error correction code (ECC) engine.

In some embodiments, the defective cell information may be stored in a basic input/output system (BIOS) memory.

In some embodiments, the defective cell information is stored in a complementary metal-oxide semiconductor (CMOS) memory.

In some embodiments, the basic input/output system service routine may be executed according to a program stored in a basic input/output system (BIOS) memory.

According to another aspect of the inventive concept, a method for repairing one or more defective memory cells of a semiconductor memory device may include checking whether an error has occurred in data read from the semiconductor memory device; generating a system management interrupt to invoke a basic input/output system service routine when it is determined that the error has occurred in the read data; checking defective cell information corresponding to one or more defective memory cells causing a read error in the semiconductor memory device during execution of the basic input/output system service routine; performing a repair operation to repair the one or more defective memory cells using one or more spare memory cells, based on the defective cell information, during a runtime period of a system; and returning to a previous task environment after the basic input/output service routine is revoked when a repair operation is completed.

In some embodiments, the repair may be performed in one or more units of a plurality of rows of memory cells by current blowing.

In some embodiments, the repair may be performed in one or more units of a plurality of columns of memory cells by using an antifuse.

In some embodiments, the semiconductor memory device may be a synchronous dynamic random access memory (SDRAM) including a spare memory cell array.

In some embodiments, the system management interrupt may be generated by an SDRAM controller.

According to still another aspect of the inventive concept, a repair method for a memory included in a system may include generating a system management interrupt (SMI) by a controller, when an error of the memory has occurred during an execution of an operating system (OS) for the system; entering a basic input/output system (BIOS) service routine in response to the SMI indicating that the error has occurred; and performing a repair operation to repair the error of the memory when a basic input/output system (BIOS) service routine is executed.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION OF THE EMBODIMENTS

Figure 1:
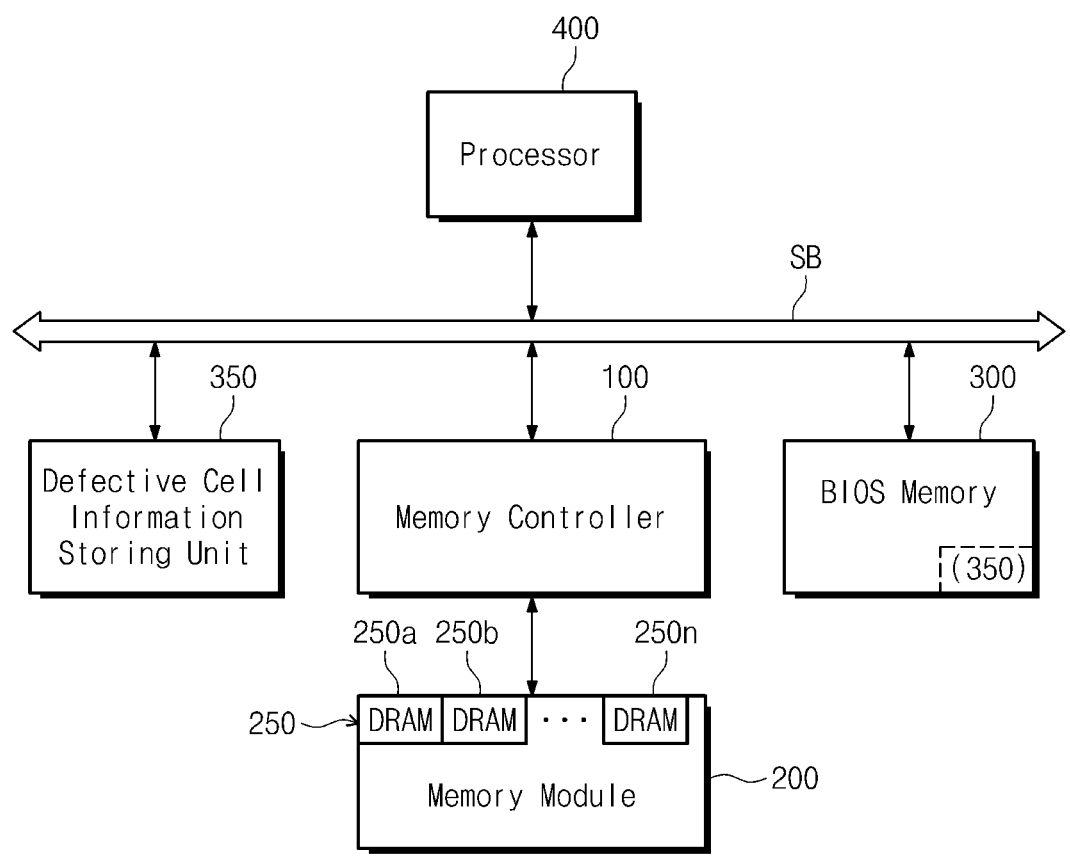
FIG. 1 is a block diagram of a data processing system according to example embodiments.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements. Other words used to describe relationships between elements should be interpreted in a like fashion (i.e., "between" versus "directly between," "adjacent" versus "directly adjacent," etc.).

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the inventive concept. As used herein, the term "and/or" includes any and all combinations of one or more of the associated listed items. Expressions such as "at least one of," when preceding a list of elements, modify the entire list of elements and do not modify the individual elements of the list.

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment and the details of basic data access operations to a DRAM or a memory module and internal function circuits and the details of a module structure and a structure or shape of a module tab area not described in order not to make the subject matter of the disclosure ambiguous.

FIG. 1 is a block diagram of a data processing system according to example embodiments. As illustrated, the data processing system may include a memory controller 100, a memory module 200, a basic input/output system (BIOS) memory 300, a defective cell information storage unit 350, and a processor 400.

The memory module 200 includes a plurality of memories, for example, DRAMs 250a, 250b, . . . , and 250n mounted on a printed circuit board (PCB). Among the DRAMs 250a, 250b, . . . , and 250n, hereinafter, a certain DRAM 250 will often be referred to as a semiconductor memory device. Each DRAM may include, for example, a semiconductor chip or stack of chips, a package including one or more semiconductor chips, or a package-on-package device.

A semiconductor memory device includes a memory cell array that includes normal memory cells and spare memory cells. The normal memory cells are used to store write data or output read data during a memory access operation. The spare memory cells are disposed in a redundancy memory area and used to repair defective memory cells among the normal memory cells. For example, when a certain normal memory cell has a defect, the defective memory cell is replaced with a spare memory cell. Thus, when an address is applied to access the certain normal memory cell, a wordline or a column select line connected to the certain normal memory cell is disabled while a spare wordline or a spare column select line connected to the replaced spare memory cell is enabled. For example, defective memory cells disclosed herein may include one or more defective memory cells. Also, spare memory cells disclosed herein may include one or more spare memory cells.

Although there may be various repair methods, a row unit repair method for repair in units of wordlines and a column unit repair method for repair in units of columns may often be used.

The memory controller 100 connected to the semiconductor memory device 250 may check a data read error of memory cells of the semiconductor memory device 250 through an operation of an ECC engine. As a result, the memory controller 100 checks whether an error has occurred in data read from the semiconductor memory device 250 and generates a system management interrupt (SMI) when the error has occurred in the read data. Since the system management interrupt (SMI) is provided to the processor 400 through a system bus SB, a basic input/output system service routine of the BIOS memory 300 is invoked.

During an execution of the basic input/output system (BIOS) service routine, a repair task may be performed such that defective memory cells causing a read error in the semiconductor memory device 200 may be repaired using spare memory cells.

The repair task may include an operation of checking and storing defective cell information corresponding to the defective memory cells causing the read error in the semiconductor memory device. For example, the defective cell information may relate to one or more addresses, and the one or more addresses may correspond to a single bit error, one or more defective rows, or one or more defective columns of the semiconductor memory device.

The defective cell information storage unit 350 may store the defective cell information as binary data. The defective cell information may also be stored in a register in the memory controller 100 or the BIOS memory 300.

In another embodiment, the repair task may include checking defective cell information corresponding to defective memory cells causing the read error in the semiconductor memory device and repairing the defective memory cells by spare memory cells during a runtime period based on the defective cell information.

The runtime means a step of an operation of a data processing system by an operating system (OS) after booting operation of the data processing system is completed. On the other hand, POST means a power-on self test during the booting and is an operation mode executed to check a memory during initial booting.

The repair may be performed in units of rows or columns of memory cells.

In embodiments of the inventive concept, a repair method may be classified into two types as below.

In one embodiment, a first method is to perform a substantial repair after rebooting a system even without the function of a memory controller. For another example, a second method is to repair the defective memory cells by spare memory cells during a runtime period of the system when the function of a memory controller is supported.

According to the first method, defective cell information corresponding to defective memory cells causing a read error in a semiconductor memory device is stored once when a basic input/output system (BIOS) service routine is executed. The defective cell information may refer to one or more failed addresses corresponding to the defective memory cells.

When the system is rebooted, the defective cell information is read during POST of a basic input/output system (BIOS). Before an operating system (OS) is loaded, a repair operation is performed to repair the defective memory cells by spare memory cells based on the defective cell information.

A basic input/output system service routine may be performed according to a program stored in a BIOS memory.

In one embodiment, according to the second method, checking is made on whether an error has occurred in data read from a semiconductor memory device. When the error has occurred in the read data, a system management interrupt (SMI) is generated to invoke a basic input/output system service routine. The defective cell information (e.g., error information) corresponding to defective memory cells causing a read error in the semiconductor memory device is checked when the basic input/output system service routine is executed without rebooting the system. Therefore, when the error of the memory occurs during executing an operating system (OS), the SMI is generated and the BIOS service routine is executed in response to the SMI indicating that the error has occurred. Thus, checking the defective cell information may occur when the BIOS is executed.

In addition, a repair operation is also performed based on the defective cell information during executing the BIOS such that the defective memory cells are repaired by spare memory cells. In one embodiment, since the repair is not performed after the system is rebooted, defective cell information may not need to be separately stored. The repair may be automatically performed during a runtime period before a user of the system is aware of it.

In one embodiment, after the repair operation is completed, the basic input/output system service routine is revoked and a processing task returns to a previous task environment (e.g., executing the OS).

In one embodiment, the repair operation may be performed by rupturing an antifuse disposed in the semiconductor memory device by a blowing manner.

The semiconductor memory device may be, for example, a DRAM or a synchronous DRAM (SDRAM) each including spare memory cells. When the semiconductor memory device is a DRAM, the memory controller 100 may function as a DRAM controller. When the semiconductor memory device is an SDRAM, the memory controller 100 may function as an SDRAM controller.

The memory controller 100 may be connected to a host such as a processor or a microprocessor. The memory controller 100 applies a read command or a write command to the semiconductor memory device 250 when receiving a data read request or a data write request from the processor 400 that is the host.

The semiconductor memory device 250 receives a command, an address, and data from the memory controller 100. The semiconductor memory device 250 outputs data read from a memory cell to the memory controller 100.

The memory controller 100 may generate a system management interrupt (SMI) when a defect occurs in the DRAM.

The semiconductor memory device 250 may constitute a multi-channel semiconductor device that includes two dies (e.g., chips). As a result, a single die becomes a single chip. Of two chips, a first chip may be a first die manufactured from a wafer and a second chip may be a second die manufactured from the same wafer or a different wafer.

A die means an individual chip manufactured from a wafer. Before a plurality of dies are divided from a wafer, their dies are manufactured at one time through various semiconductor manufacturing processes to constitute individual chips, respectively. An oxidation process, a photolithography process, a thin film formation process, an etch process or a chemical mechanical polishing (CMP) process may be one of the various semiconductor manufacturing processes.

As used herein, a semiconductor device may refer to various items such as a memory device, one or more logic devices or memory cells formed in or on a semiconductor substrate, a semiconductor chip, a memory chip, a memory die, a logic chip, a package, or combinations thereof. A semiconductor device such as a semiconductor chip, a memory chip, a memory die, or a logic chip may be formed from a wafer. A semiconductor device may comprise a package which may include one or more chips stacked on a package substrate, or a package-on-package device including a plurality of packages. A semiconductor memory device refers to a semiconductor device that includes one or more memory array, such as a semiconductor memory chip (e.g., volatile or non-volatile memory).

An electronic device, as used herein, may refer to one of these devices and may also include products that include these devices, such as a memory card, a memory module, a hard drive including additional components, a mobile phone, laptop, tablet, desktop, camera, server, computing system, memory system, or other consumer electronic device, etc.

Figure 2:
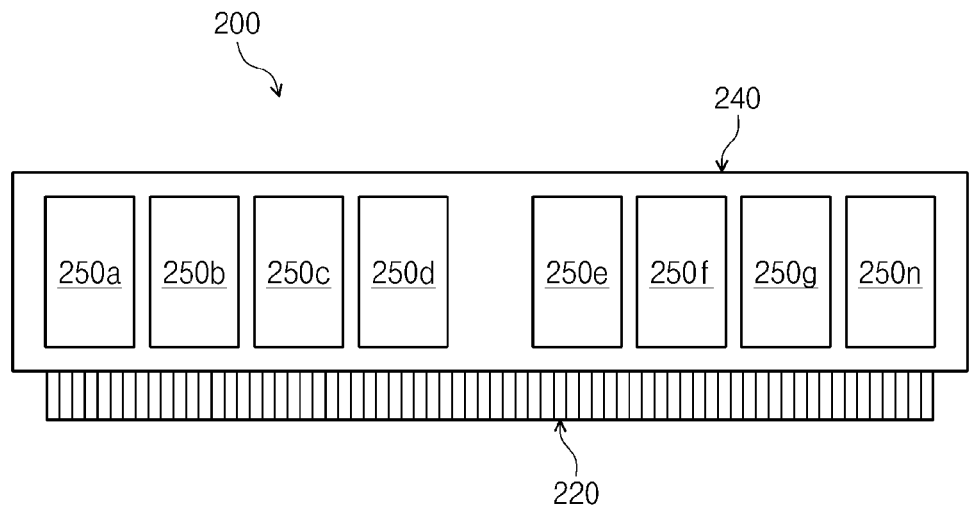
FIG. 2 is an exemplary diagram showing the form of one surface of a memory module in FIG. 1 according to example embodiments.

FIG. 2 is an exemplary diagram showing the form of one surface of the memory module 200 of FIG. 1. As illustrated, the memory module 200 may include a plurality of DRAMs 250a to 250n mounted on a printed circuit board 240 (PCB). The memory module 200 includes a tab region 220 inserted into a slot formed at the data processing system to be electrically connected to the memory controller 100.

In the DRAMs 250a to 250n, memory cells may be failed due to variation of an operation environment such as PVT or with the lapse of used time during their operation.

Figure 3:
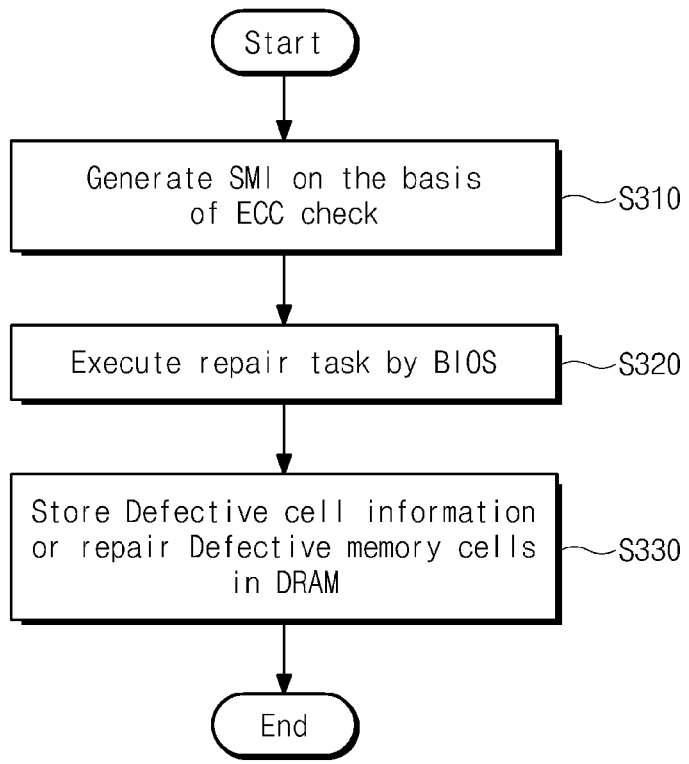
FIG. 3 is a flowchart summarizing execution of a repair task for a memory of FIG. 1 according to example embodiments.

FIG. 3 is a flowchart summarizing execution of a repair task for a memory of FIG. 1 according to example embodiments. Referring to FIG. 3, a method for repairing a defective memory cell of a semiconductor device according to an embodiment of the inventive concept starts with checking whether an error has occurred in data read from the semiconductor memory device through an operation of an error correction code (ECC) engine. For example the ECC engine may be located in at least one of a memory, a memory module, a memory controller, and a system.

When the error has occurred in the read data, a system management interrupt is generated to invoke a basic input/output service system routine (S310).

During execution of the basic input/output system service routine, a repair task is performed to repair defective memory cells causing a read error in the semiconductor memory device by spare memory cells (S320).

In order to complete preparation or direct execution of the repair task, defective cell information corresponding to defective memory cells may be stored to perform a repair operation during rebooting the system or defective memory cells in a DRAM are directly repaired by spare memory cells (S330).

Figure 4:
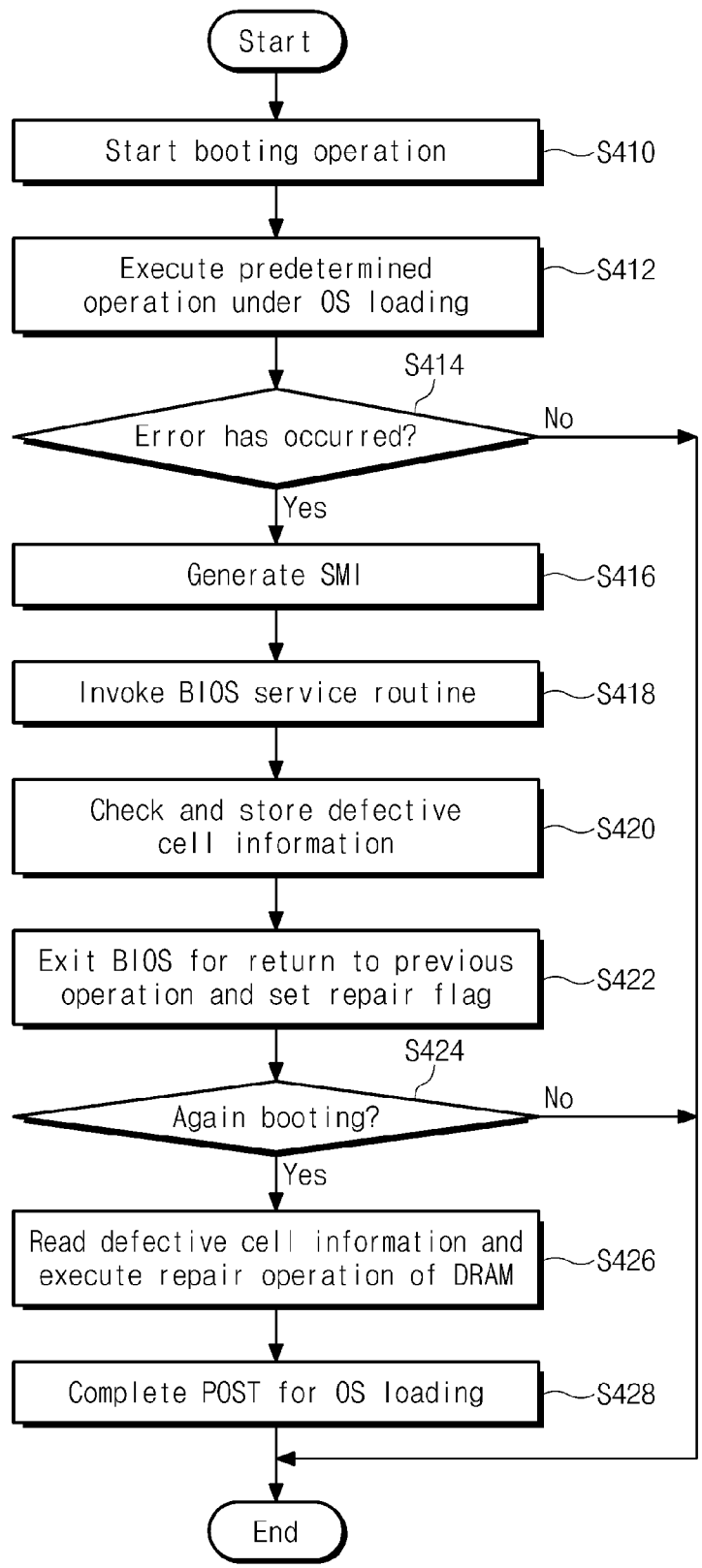
FIG. 4 is a flowchart illustrating a repairing operation of a memory of FIG. 1 according to example embodiments.

FIG. 4 is a flowchart illustrating a repairing operation of a memory of FIG. 1 according to example embodiments. FIG. 4 illustrates the first method, in which a substantial repair operation is performed after rebooting the system.

In one embodiment, after a booting operation of the system starts (S410), a predetermined operation is performed under loading of an operation system (OS) (S412). The processor 400 may use the semiconductor memory device 250 of the memory module 200 as a working memory to perform the predetermined operation. The memory controller 100 accesses the semiconductor memory device 250 to write data into a selected memory cell or read data from the selected memory cell. The read data is provided to the processor 400 through a system bus SB.

When the selected memory cell is in a failed state, the read data may include an error. The memory controller 100 may check the read data with an error correction code (ECC) engine to determine whether an ECC error has occurred. The error may correspond to one or more rows or one or more columns of the semiconductor memory device.

When a result of the checking is that the error has occurred (S414), the memory controller 100 generates a system management interrupt (SMI) to perform a repair task according to the disclosed embodiments (S416). For example, the error may have occurred based on a result from an operation of the ECC engine or without the operation of the ECC engine. The generated SMI is applied to the processor 400 through the system bus SB. The processor 400 stops a currently performed task (e.g., executing an operating system) and invokes a basic input/output system (BIOS) service routine when the SMI is requested. Thus, invocation of the BIOS service routine is performed (S418).

When the BIOS service routine is executed, defective memory cells causing a read error in the semiconductor memory device are checked and defective cell information is stored in a register in the controller 100, the defective cell information storage unit 350, or the BIOS memory 300 (S420). In one embodiment, after the defective cell information, for example, a failed physical address is checked, the failed physical address may change to information, for example, a logical address to store or read the logical address.

In one embodiment, the BIOS service routine may be executed according to a program stored in the BIOS memory 300.

When the operation of S420 is completed, the operation proceeds to S422 to exit from the BIOS service routine. Thus, a processing task returns to a previous task before entering the BIOS service routine (e.g., executing an operating system). In one embodiment, a repair flag may be set to perform a repair operation at a power-on self test (POST) after system rebooting. For example, the repair flag may be generated when a number of errors of the memory is greater than a reference value and then the host 400 may inform the repair flag to the memory controller 100, the defective cell storage unit 350, or the BIOS memory 300.

The repair flag may be stored in a register in the memory controller 100, the defective cell storage unit 350, or the BIOS memory 300.

When the data processing system is rebooted after being powered off (S424), the defective cell information is read during the POST of the BIOS. Before the operating system (OS) is loaded, a repair operation is performed to repair the defective memory cells by spare memory cells based on the read defective cell information.

The repair operation is completed for the OS loading (S428). When the repair operation is completed, the OS may be loaded to the memory module 200.

According to FIG. 4, when the system is rebooted after defective cell information is stored, defective memory cells of a semiconductor memory device are repaired using spare memory cells.

Figure 5:
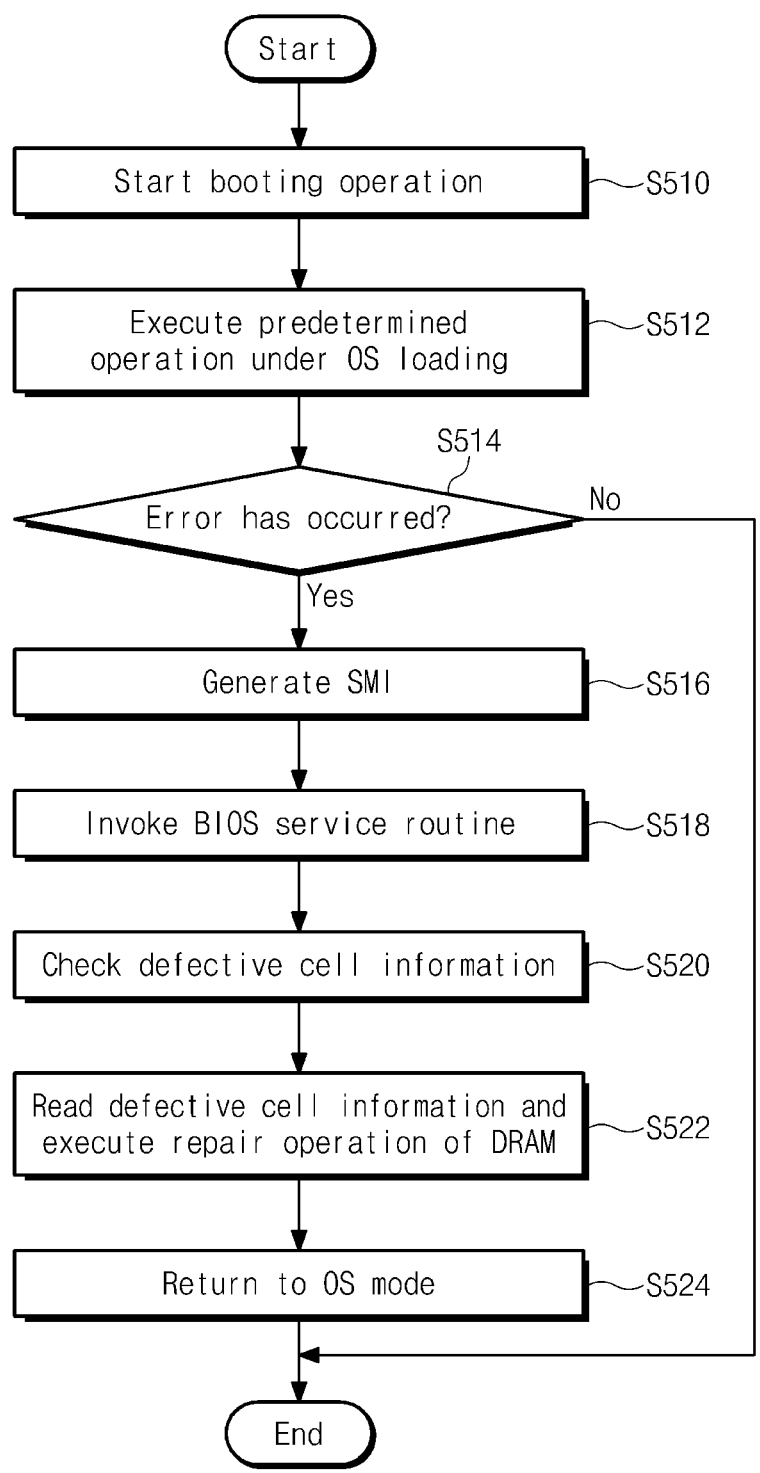
FIG. 5 is a flowchart illustrating a repairing operation of a memory of FIG. 1 according to example embodiments.

FIG. 5 is a flowchart illustrating a repairing operation of a memory according to example embodiments. The second repair method will be described in detail with reference to the flowchart in FIG. 5, in which defective memory cells are repaired by spare memory cells during a runtime period of a system when a function of a memory controller is supported.

Referring to FIG. 5, after a booting operation of the system starts (S510), a predetermined operation is performed under loading of an operating system (OS) (S512). The processor 400 may use the semiconductor memory device 250 of the memory module 200 as a working memory to perform a predetermined operation. The memory controller 100 accesses the semiconductor memory device 250 to write data into a selected memory cell or read data from the selected memory cell. The read data is provided to the processor 400 through the system bus SB.

When the selected memory cell is in a failed state, the read data may include an error. The memory controller 100 may check the read data with an ECC engine to determine whether an ECC error has occurred.

When a result of the checking is that the ECC error has occurred (S514), the memory controller 100 generates an SMI to perform a repair task according to the inventive concept (S516). For example, the error may have occurred based on a result from an operation of the ECC engine or without the operation of the ECC engine. The generated SMI is applied to the processor 400 through the system bus SB. The processor 400 stops a currently performed task (e.g., executing an operating system) and invokes a basic input/output system (BIOS) service routine when the SMI is requested. Thus, invocation of the BIOS service routine is performed (S518).

When the BIOS service routine is executed, defective memory cells causing a read error in the semiconductor memory device are checked (S520), which occurs during a runtime of the system. The BIOS service routine may be executed according to a program stored in a BIOS memory 300.

After the defective cell information is checked (S520), the defective cell information is read (S522). In addition, a repair operation is performed to repair the defective memory cells using spare memory cells based on the read defective cell information, when the BIOS is executed. In one embodiment, after the defective cell information, for example, a failed physical address is checked, the failed physical address may change to information, for example, a logical address to store or read the logical address.

When the repair operation is completed, the operation proceeds to S524 to exit from the BIOS service routine. Thus, a processing task returns to a previous task before entering the BIOS service routine (e.g., executing an operating system).

According to FIG. 5, after defective cell information is checked, a defective memory cell of a semiconductor memory device is repaired by a spare memory cell in a user level without rebooting the system. Since the repair operation is not performed after rebooting the system, defective cell information need not be separately stored until the system is powered off. As a result, the repair operation may be automatically performed during the runtime period of the system before a user of the system is aware of it. In one embodiment, the repair operation may be performed by the memory controller 100. For example, the memory controller 100 may stop a read or a write operation from/to a memory for the repair operation.

In one embodiment, the repair operation may be performed by rupturing an antifuse disposed in the semiconductor memory device by a blowing manner.

Figure 6:
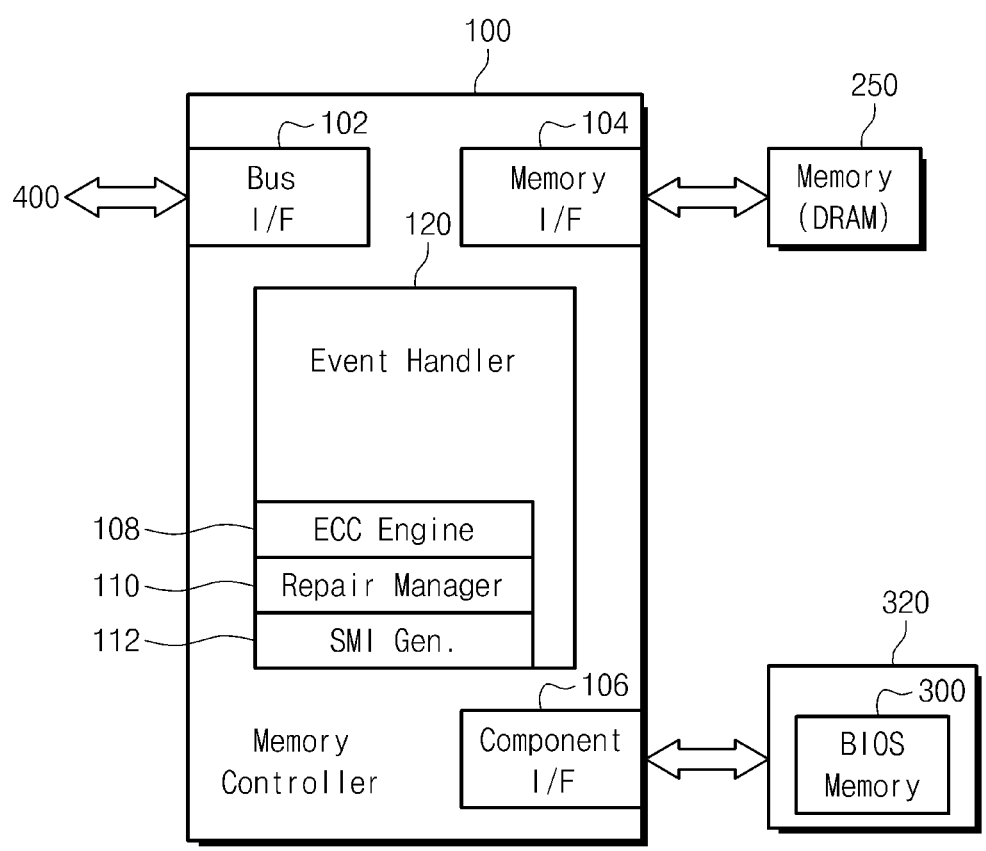
FIG. 6 is an exemplary block diagram illustrating a detailed configuration of a memory controller in FIG. 1 according to example embodiments.

FIG. 6 is an exemplary block diagram illustrating a detailed configuration of the memory controller 100 in FIG. 1 according to example embodiments. As illustrated, the memory controller 100 includes an event handler 120. The event handler 120 may include an ECC engine 108, a repair manager 110, and an SMI generator 112.

The ECC engine 108 performs an ECC operation on read data or write data to correct a bit error. The repair manager 110 enables an SMI generation control signal according to an error correction result of the ECC engine 108. When the SMI generation control signal is enabled, an SMI is generated from the SMI generator 112. The SMI is provided to a processor 400 through a bus interface 102 connected to a system bus SB.

The memory controller 100 may include a memory interface 104 and a component interface 106 other than the bus interface 102.

The memory interface 104 is in charge of interfacing between a memory 250 including a DRAM or the like and the memory controller 100.

The component interface 106 is in charge of interfacing between the nonvolatile memory device 320 such as the BIOS memory 300 and the memory controller 100.

Although a DRAM is connected as a memory in FIG. 6, other memories, for example, a static random access memory (SRAM), an NAND flash memory, a NOR flash memory, a mobile DRAM, a phase random access memory (PRAM), a ferroelectric random access memory (FRAM), a resistive random access memory (RRAM), a magnetic random access memory (MRAM), etc. may be used instead of the DRAM in other cases.

Volatile memory devices such as SRAM and DRAM may lose their stored data when their power supplies are interrupted.

Meanwhile, nonvolatile memory devices such as MRAM retain their stored data even when their power supplies are interrupted. Accordingly, nonvolatile memory devices are preferentially used to store data when data does not want to be lost by power failure or power-off.

When a spin transfer torque magneto resistive random access memory (STT-MRAM) constitutes a memory module, advantages of an MRAM may be added to the advantages of a DRAM.

An STT-MRAM cell may include a magnetic tunnel junction (MTJ) element and a selection transistor. The MTJ element may basically include a pinned layer, a free layer, and a tunnel layer disposed therebetween. A magnetization direction of the free layer is fixed and may be identical or opposite to that of the pinned layer.

Figure 7:
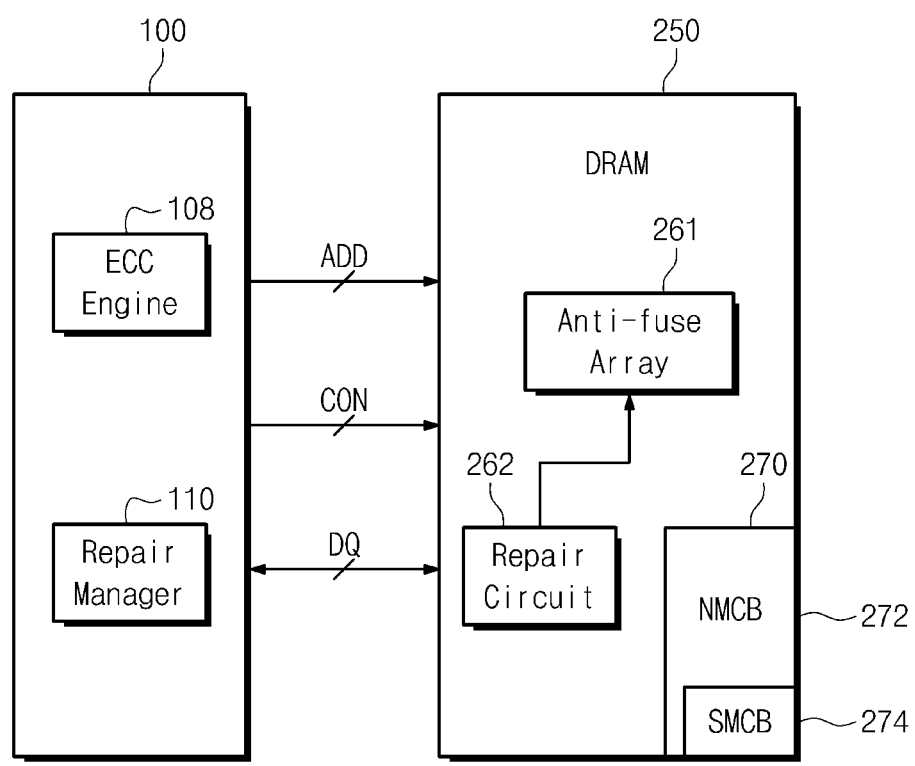
FIG. 7 is an exemplary block diagram illustrating a detailed configuration of a DRAM connected to the memory controller of FIG. 6 according to example embodiments.

FIG. 7 is an exemplary block diagram illustrating a detailed configuration of a DRAM 250 connected to the memory controller 100 of FIG. 6 according to example embodiments. As illustrated, the DRAM 250 includes a repair circuit 262, an antifuse array 261, and a memory cell array 270. The repair circuit 262 serves to apply blowing current to corresponding antifuses in the antifuse array 261 in response to an address applied during a repair operation. Thus, defective memory cells in a normal memory cell block 272 of the memory cell array 270 are replaced with spare memory cells in a spare memory cell block 274. For example, when an address is applied to access defective memory cells during a memory access operation, the spare memory cells are accessed instead of the defective memory cells by redundancy information stored in the antifuse array 261. The repair operation may be performed in units of rows or columns.

Although FIG. 7 shows that the memory controller 100 includes the ECC engine 108 and the repair manager 110, the memory controller 100 may further include the same circuit configuration as shown in FIG. 6.

Figure 8:
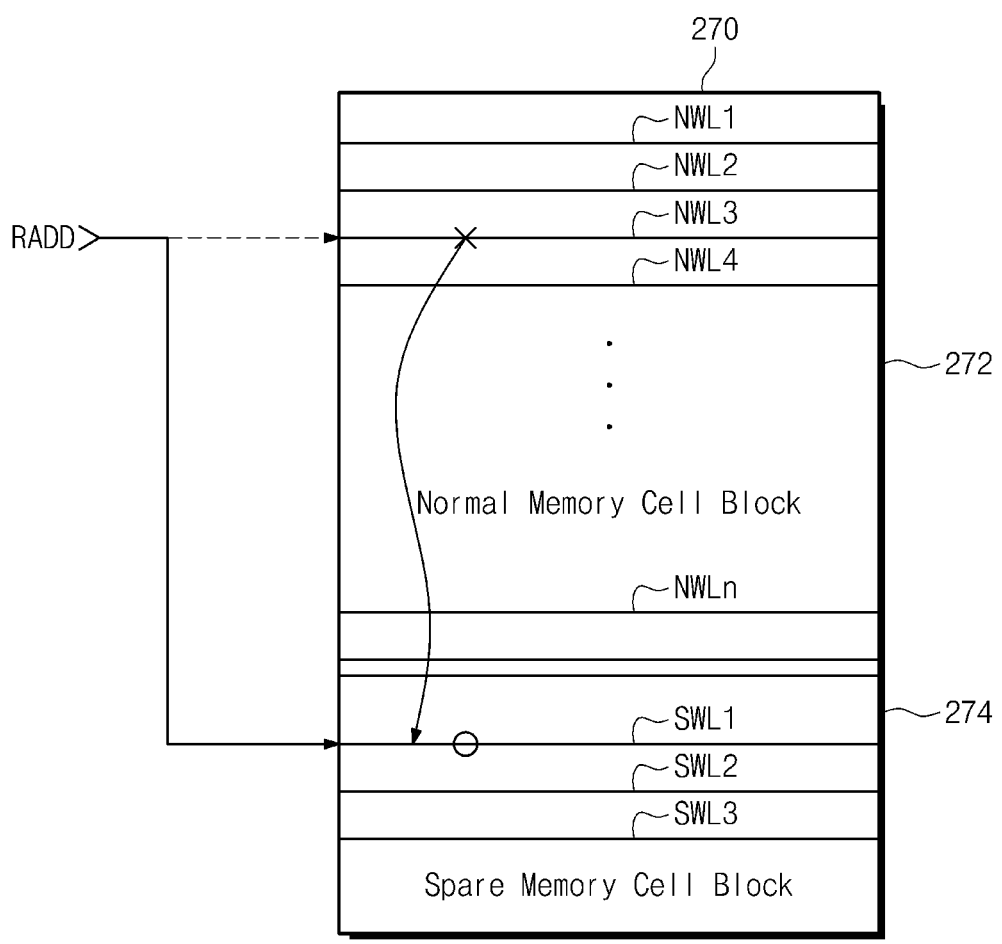
FIG. 8 is an exemplary diagram illustrating the repair principle of a row unit in the DRAM of FIG. 7 according to example embodiments.

FIG. 8 is an exemplary diagram illustrating the repair principle of a row unit in the DRAM 250 of FIG. 7 according to example embodiments. As illustrated, the memory cell array 270 includes a normal memory cell block 272 and a spare memory cell block 174. The normal memory cell block 272 may be a portion constituting a memory bank, and a plurality of memory banks may constitute the memory cell array 270.

The normal memory cell block 272 includes a plurality of normal memory cells each being connected to one of a plurality of normal wordlines NWL to NWLn. A single normal memory cell may be a DRAM cell including a single access transistor and a single storage capacitor.

The spare memory cell block 274 includes a plurality of spare memory cells each being connected to one of a plurality of spare wordlines SWL1 to SWL3. A single spare memory cell may be a DRAM cell that is identical to a single normal memory cell.

In FIG. 8, when at least one of a plurality of normal memory cells connected to a third normal wordline NWL3 among the normal wordlines NWL to NWLn is determined to be defective, the at least one defective memory cell may be replaced in a unit of row. For example, the third normal wordline NWL3 is replaced with a first spare wordline SWL1 by performing a repair operation.

When a row address is applied to access a row of defective memory cells during a memory access operation, a first spare wordline SWL1 is enabled instead of the third normal wordline NWL3 by redundancy information stored in the antifuse array 261.

In FIG. 8, a row-unit repair scheme has been described. However, it will be understood that a repair performing column-unit replacement in response to a column address may be implemented.

Figure 9:
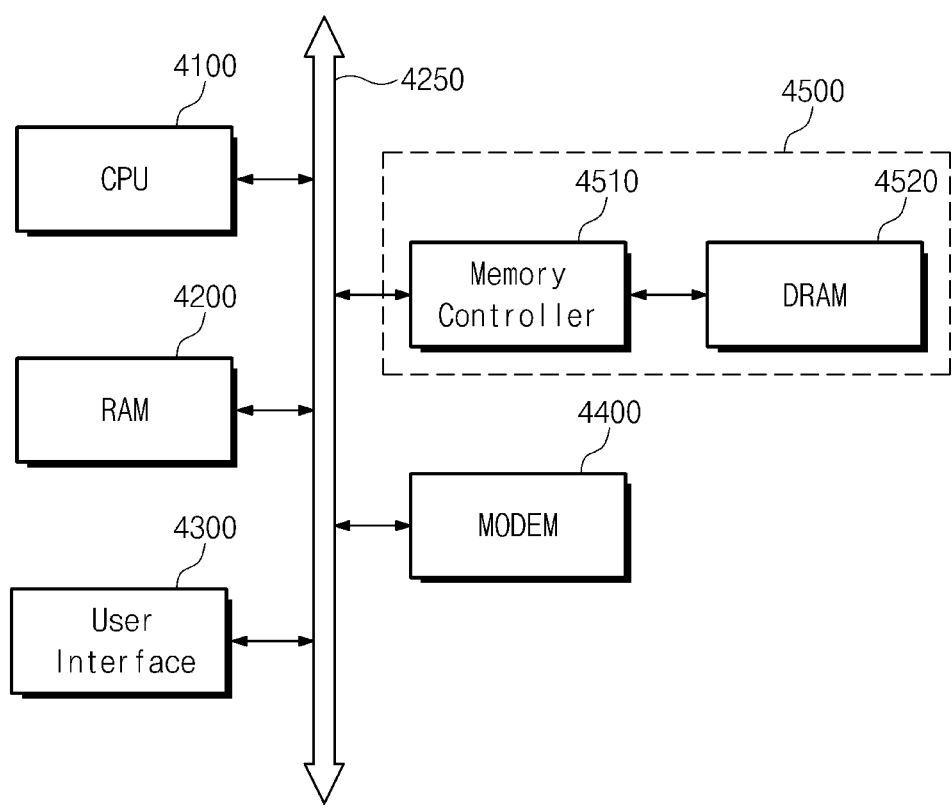
FIG. 9 is a block diagram illustrating a computing device according to example embodiments.

FIG. 9 is a block diagram illustrating a computing device according to certain embodiments. As illustrated, the computing device may include a memory system 4500 including a DRAM 4520 and a memory controller 4510. The computing device may include an information processing device or a computer. The computing device may further include a modem 4400, a central processing unit (CPU) 4100, a RAM 4200, and a user interface 4300 that are electrically connected to a system bus 4250. Data processed by the CPU 4100 or externally input data may be stored in the memory system 4500.

When the DRAM 4520 is a DDR4 DRAM, the DRAM 4520 may be manufactured with at least two dies in a mono package. When the memory controller 4510 generates an SMI and allows a repair task to be performed as shown FIG. 4 or 5, a read error of the computing device is minimized or prevented to enhance operation performance.

The computing device may be applied to a solid state disk (SSD), a camera image sensor, and other application chipsets. In some embodiments, the memory system 4500 may be configured with an SSD. In this case, the computing device may stably and reliably store large-capacity data in the memory system 4500.

Since the memory system 4500 may also be implemented with the memory system in FIG. 7, performance of the computing device may be improved. The memory controller 4510 may apply a command, an address, data or other control signals to the DRAM 4520.

The CPU 4100 functions as a host and controls the overall operation of the computing device.

A host interface between the CPU 4100 and the memory controller 4150 may include various protocols for data exchange between a host and the memory controller 4500. In exemplary embodiments, memory controller 4510 may be configured to communicate with a host or an external device through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

The computing device shown in FIG. 9 may be applied as one of a computer, an Ultra Mobile PC (UMPC), a digital picture player, a digital video recorder, a digital video player, a storage constituting a data center, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

Figure 10:
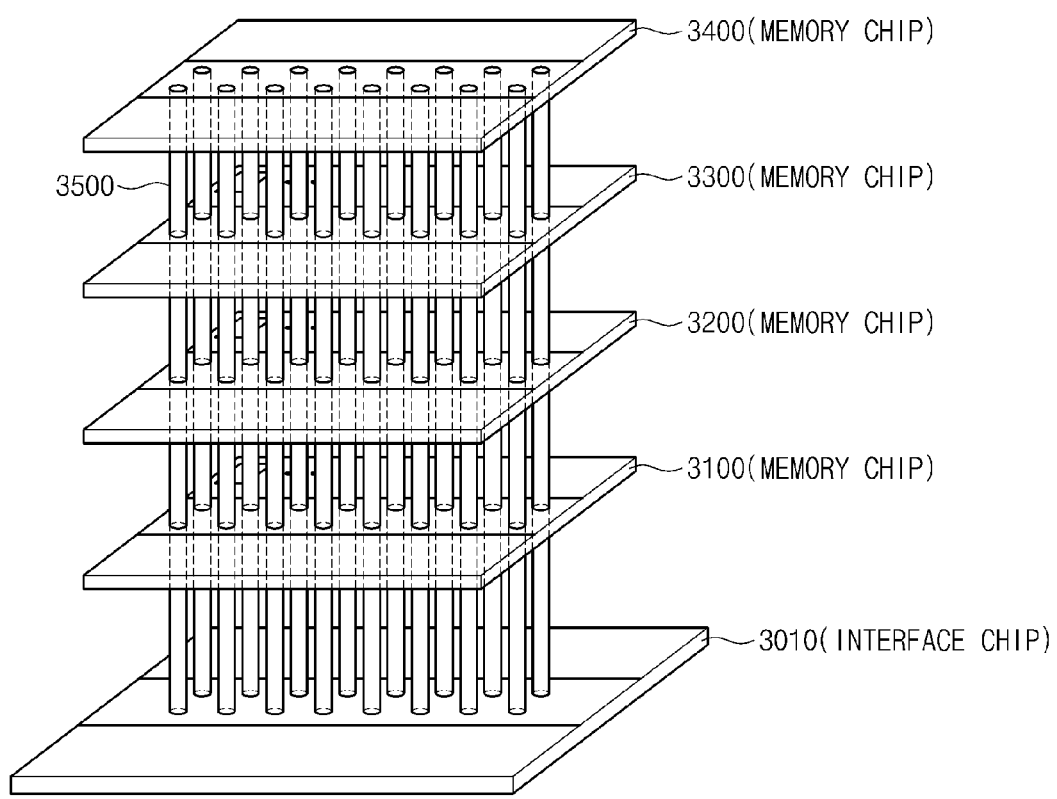
FIG. 10 is a memory module stacked through through-substrate vias (TSVs) according to certain embodiments.

FIG. 10 is a memory module stacked through through-substrate vias (e.g., through-silicon vias (TSVs)) according to certain embodiments. Referring to FIG. 10, an interface chip 3010 is disposed at a lowermost layer and memory chips 3100, 3200, 3300, and 3400 are disposed thereon. Each of the memory chips 3100, 3200, 3300, and 3400 may include a plurality of dies. Chips may be connected through a micro bump (uBump). A command, an address, and data between chips may be connected through TSVs 3500. For example, two or more chips may be stacked.

In the case of FIG. 10, each of the memory chips 3100, 3200, 3300, and 3400 may be implemented with a multi-channel semiconductor device formed by two or more dies. As described above, when a memory module of a single memory is constituted, the memory module may be connected to a memory controller. When an ECC error has occurred during operation of the memory chips, the memory controller generates an SMI and allows a repair task to be performed as shown in FIG. 4 or 5. Thus, a read error in the memory module is minimized or prevented to enhance operation performance.

Figure 11:
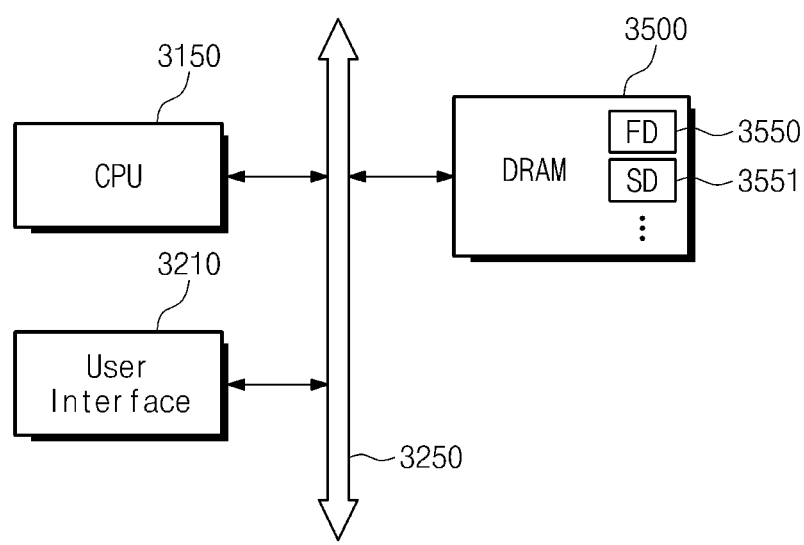
FIG. 11 is an electronic system according to certain embodiments.

FIG. 11 is an electronic system according to certain embodiments. As shown in FIG. 11, a DRAM 3500, a central processing unit (CPU) 3150, and a user interface 3210 are connected to each other through a system bus 3250.

When the electronic system is a handheld electronic device, it may be connected to an external communication device through a separate interface. The communication device may be a digital versatile disc (DVD) player, a computer, a set top box (STB), a digital camcorder, and the like.

The DRAM 3500 may have a configuration where two or more dies 3550 and 3551 are packaged into a single package. For example, the DRAM 3500 may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In FIG. 11, a flash memory may be further connected to the bus 3250. However, the inventive concept is not limited thereto and various types of nonvolatile storages may be used.

The nonvolatile storage may store data information having various data types such as text, graphics, and software code.

In case of FIG. 11, the CPU 3150 may generate an SMI and perform a repair task as shown in FIG. 4 or 5. Therefore, a read error of the electronic system is minimized or prevented to enhance operating performance.

Figure 12:
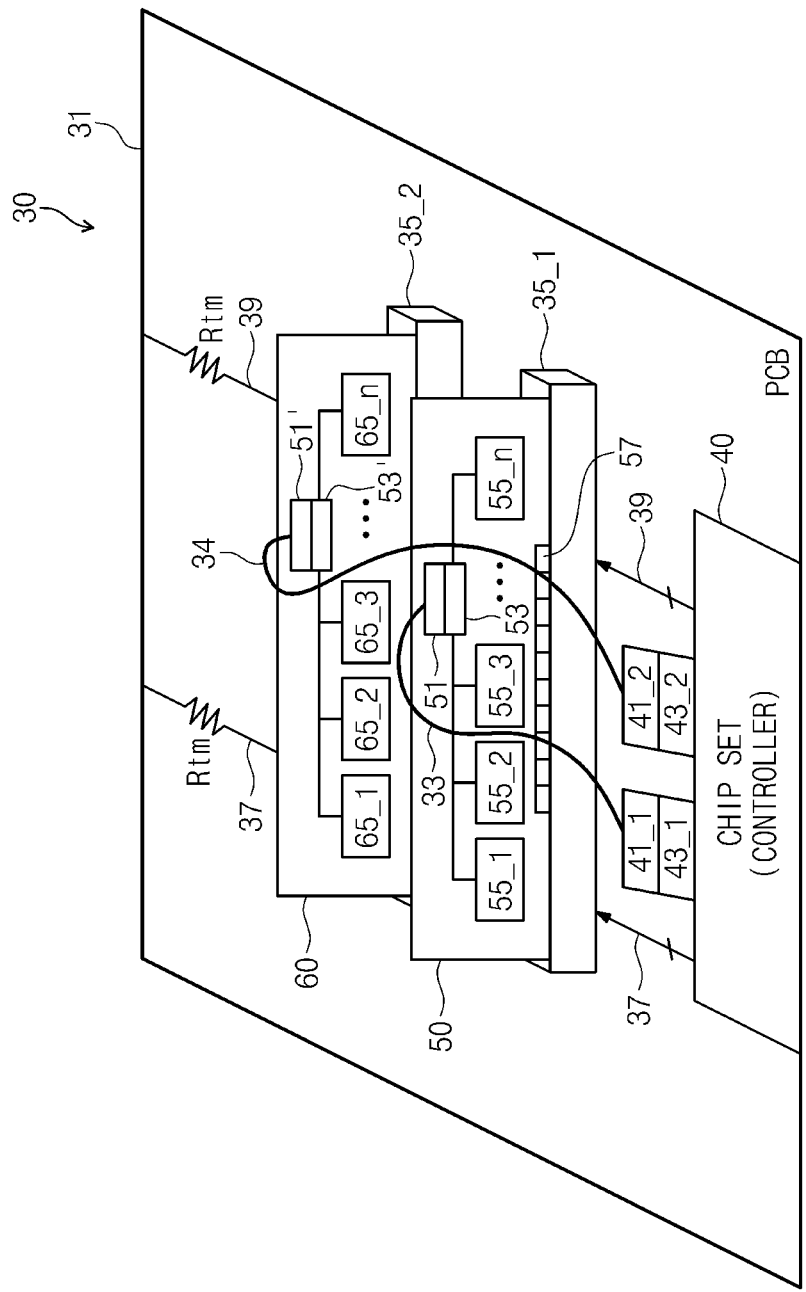
FIG. 12 is a block diagram illustrating an optical I/O schema according to certain embodiments.

FIG. 12 is a block diagram illustrating an optical I/O schema according to certain embodiments. As shown in FIG. 12, a memory system 30 may include a chipset 40 functioning as a memory controller mounted on a PCB main substrate 31 and a plurality of memory modules 50 and 60. The memory modules 50 and 60 are inserted into slots 35_1 and 35_2 formed on the PCB main substrate 31, respectively. The memory module 50 may include a connector 57, multi-channel DRAMs 55_1 to 55_n, an optical I/O input unit 51, and an optical I/O output unit 53.

The optical I/O input unit 51 may include an opto-electric converter (e.g., photodiode) to convert an optical signal applied to the I/O input unit 51 to an electric signal. Thus, an electric signal output from the opto-electric converter is transmitted to the memory module 50. The optical I/O output unit 53 may include an electro-optical converter (e.g., laser diode) to convert an electric signal output from the memory module 50 to an optical signal. If necessary, the optical I/O output unit 53 may include an optical modulator to modulate a signal output from a light source.

An optical cable 33 is in charge of optical communication between the optical I/O input unit 51 of the memory module 50 and an optical transmission unit 41_1 of the chipset 40. The optical communication may have a bandwidth of tens of gigabytes or more per second. The memory module 50 may receive signals or data applied from signal lines 37 and 39 of the chipset and perform high-speed data communication with the chipset 40 through the optical cable 33. Resistors Rtm formed on lines 37 and 39 are termination resistors.

As shown in FIG. 12, even in case of the memory system 30 adopting an optical I/O structure, a repair scheme according to the inventive concept may be implemented in a user level.

Accordingly, the chipset 40 may generate an SMI during detection of a read error as shown in FIG. 4 or 5 and allow a repair task to be performed by a BIOS code. Thus, a read error of the memory system 30 is minimized or prevented to enhance read operation performance.

In the memory system in FIG. 12, the multi-channel DRAMs 55_1 to 55_n may be used as user data buffer.

Figure 13:
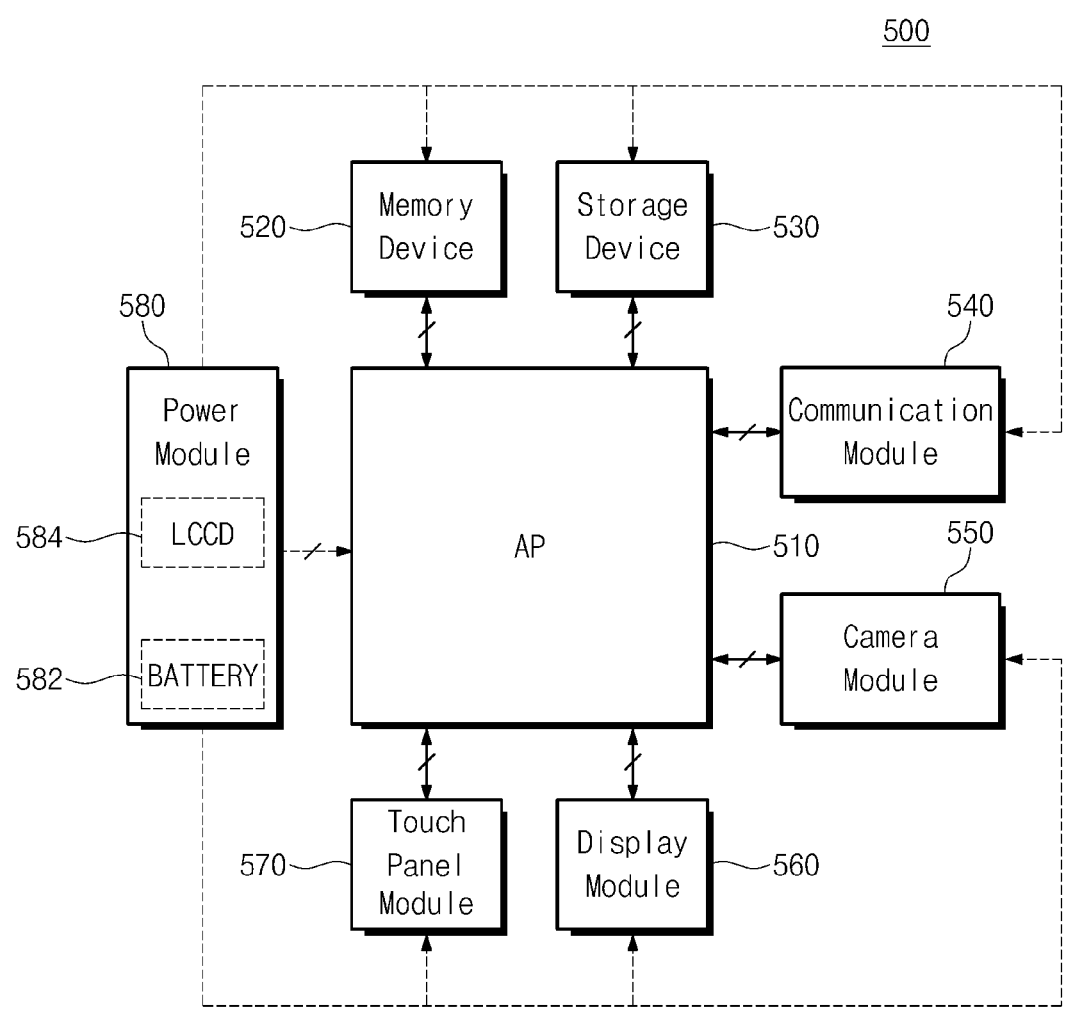
FIG. 13 is a block diagram illustrating a handheld multimedia device according to certain embodiments.

FIG. 13 is a block diagram illustrating a handheld multimedia device 500 according to certain embodiments. As illustrated, the handheld multimedia module 500 may include an AP 510, a memory device 520, a storage device 530, a communication module 540, a camera module 550, a display module 560, a touch panel module 570, and a power module 580.

The AP 510 may perform a data processing function.

In FIG. 13, the memory device 520 may include a DRAM shown in FIG. 7. Therefore, when a read error of the memory device 510 is detected, the AP 510 may generate an SMI as shown in FIG. 4 or 5 and allow a repair task to be performed by a BIOS code. Thus, operation performance of the handheld multimedia device 500 may be enhanced.

The communication module 540 connected to the AP 510 may function as a modem to transmit/receive communication data and modulate/demodulate data.

The storage device 530 may be implemented with a NOR-type or NAND-type flash memory to store high-capacity information.

The display module may be implemented as a display unit such as a liquid crystal having backlight, a liquid crystal having a light emitting diode (LED) light source or an organic LED (OLED). The display module 560 functions as an output element to display images such as letters, numbers, and figures in color.

The touch panel module 570 may solely provide a touch input to the AP 510 or may provide the touch input to the AP 510 on the display module 560.

While the handheld multimedia device 500 has been described to focus on a mobile communication device, the multimedia device 500 may function as a smart card by adding or subtracting its components, if necessary.

The handheld multimedia device 500 may connect a separate interface to an external communication device. The communication device may be a digital versatile disc (DVD) player, a computer, a set top box (STB), a game player, a digital camcorder or the like.

The power module 580 performs power management of the handheld multimedia device 500. As a result, when a PMIC scheme is applied into the multimedia device 500, power saving of the multimedia device 500 is achieved.

The camera module 550 includes a camera image processor (CIS) and is connected to the AP 510.

Although not shown in the figure, it will be understood by those skilled in the art that the handheld multimedia device 500 may further include another application chipset or a mobile DRAM.

Figure 14:
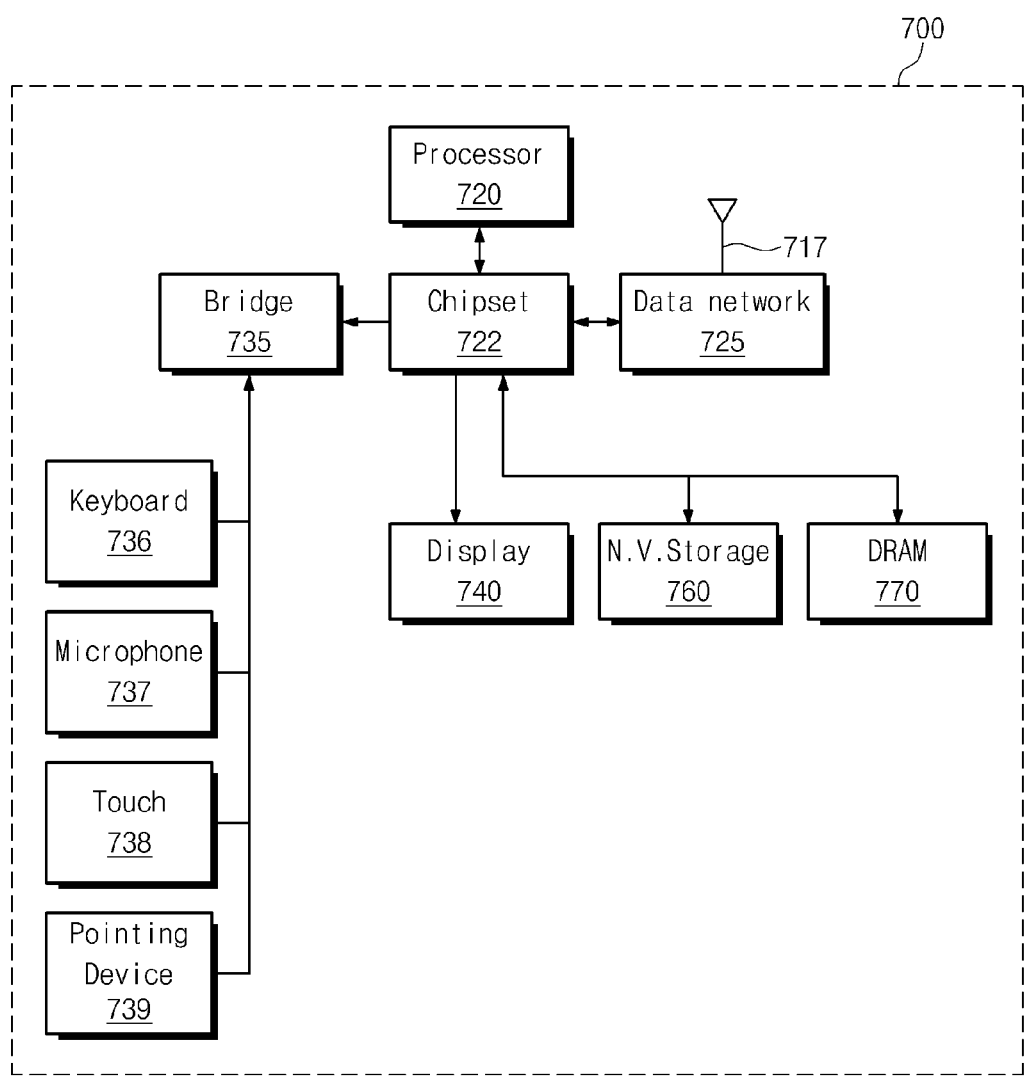
FIG. 14 is a block diagram illustrating a personal computer according to certain embodiments.

FIG. 14 is a block diagram illustrating a personal computer 700 according to certain embodiments. As illustrated, the personal computer 700 may include a processor 720, a chipset 722, a data network 725, a bridge 735, a display 740, a nonvolatile storage 760, a DRAM 770, a keyboard 736, a microphone 737, a touch unit 738, and a pointing device 739.

In FIG. 14, the DRAM 770 may have the same configuration as shown in FIG. 7. The chipset 722 functioning as a memory controller may generate an SMI during execution of a read error as shown in FIG. 4 or 5 and allow a repair task to be performed by a BIOS code. Thus, a read error of the personal computer 700 is minimized or prevented to enhance operation performed.

The chipset 722 may apply a command, an address, data or other control signals to the DRAM 770.

The processor 720 functions as a host and controls the overall operation of the personal computer 700.

A host interface between the processor 720 and the chipset 722 includes various protocols for performing data communication.

The nonvolatile storage 760 may be implemented with, for example, an electrically erasable programmable read-only memory (EEPROM), a flash memory, a magnetic RAM (MRAM), a spin-transfer torque MRAM (STT-MRAM), CBRAM (a conductive bridging RAM (CBRAM), a ferroelectric RAM (FRAM), a phase change RAM (PRAM) called an ovonic unified memory (OUM), a resistive RAM (RRAM or ReRAM), nanotube RRAM, a nanotube RRAM, a polymer RAM (PoRAM), a nano floating gate memory (NFGM), holographic memory, a molecular electronics memory device or an insulator resistance change memory.

The personal computer 700 may be provided as one of various elements constituting an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a three-dimensional television, a smart television, a digital audio recorder, a digital audio player, a digital picture recorder, a digital picture player, a digital video recorder, and a digital video player, a device capable of transmitting/receiving information in wireless environment, one of various electronic devices constituting a home network, an RFID device or one of various elements constituting a computing system.

Figure 15:
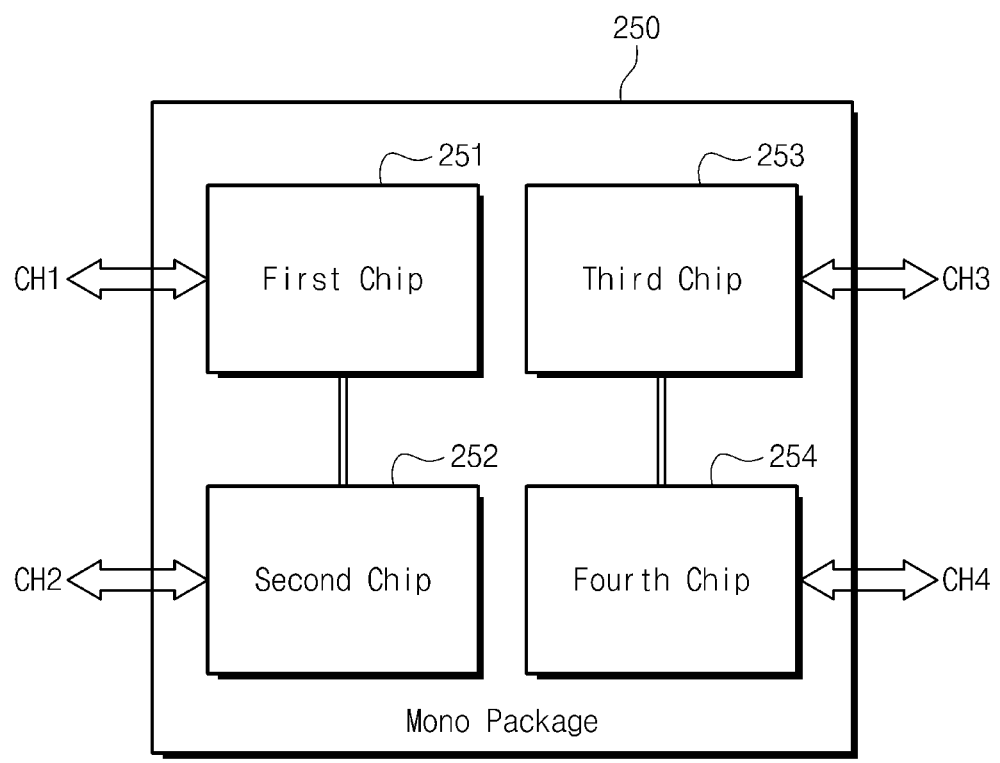
FIG. 15 is a block diagram illustrating a multi-channel semiconductor memory device according to certain embodiments.

FIG. 15 is a block diagram illustrating a multi-channel semiconductor memory device 250 according to certain embodiments. As illustrated, the multi-channel semiconductor memory device 250 includes, for example, four chips 251, 252, 253, and 254 including four dies.

A first interconnection is formed between the first chip 251 and the second chip 252, and a second interconnection is formed between the third chip 253 and the fourth chip 254.

In a mono package, the multi-channel semiconductor device 250 includes fourth channels.

Although the first chip 251 and the second chip 252 include two dies, they may perform the same data input/output operation as a two-channel semiconductor memory device manufactured from a mono die.

Although the third chip 253 and the fourth chip 254 also include two dies, they may perform the same data input/output operation as a two-channel semiconductor memory device manufactured from a mono die.

In FIG. 15, the multi-channel semiconductor memory device 250 may have the same configuration as shown in FIG. 7. When the multi-channel semiconductor memory device 250 includes a memory module to constitute a part of a memory system, a memory controller may generate an SMI and allow a repair task to be invoked the BIOS. Thus, defective memory ells in the multi-channel semiconductor memory device 250 may be repaired by spare memory cells when the BIOS is executed.

Figure 16:
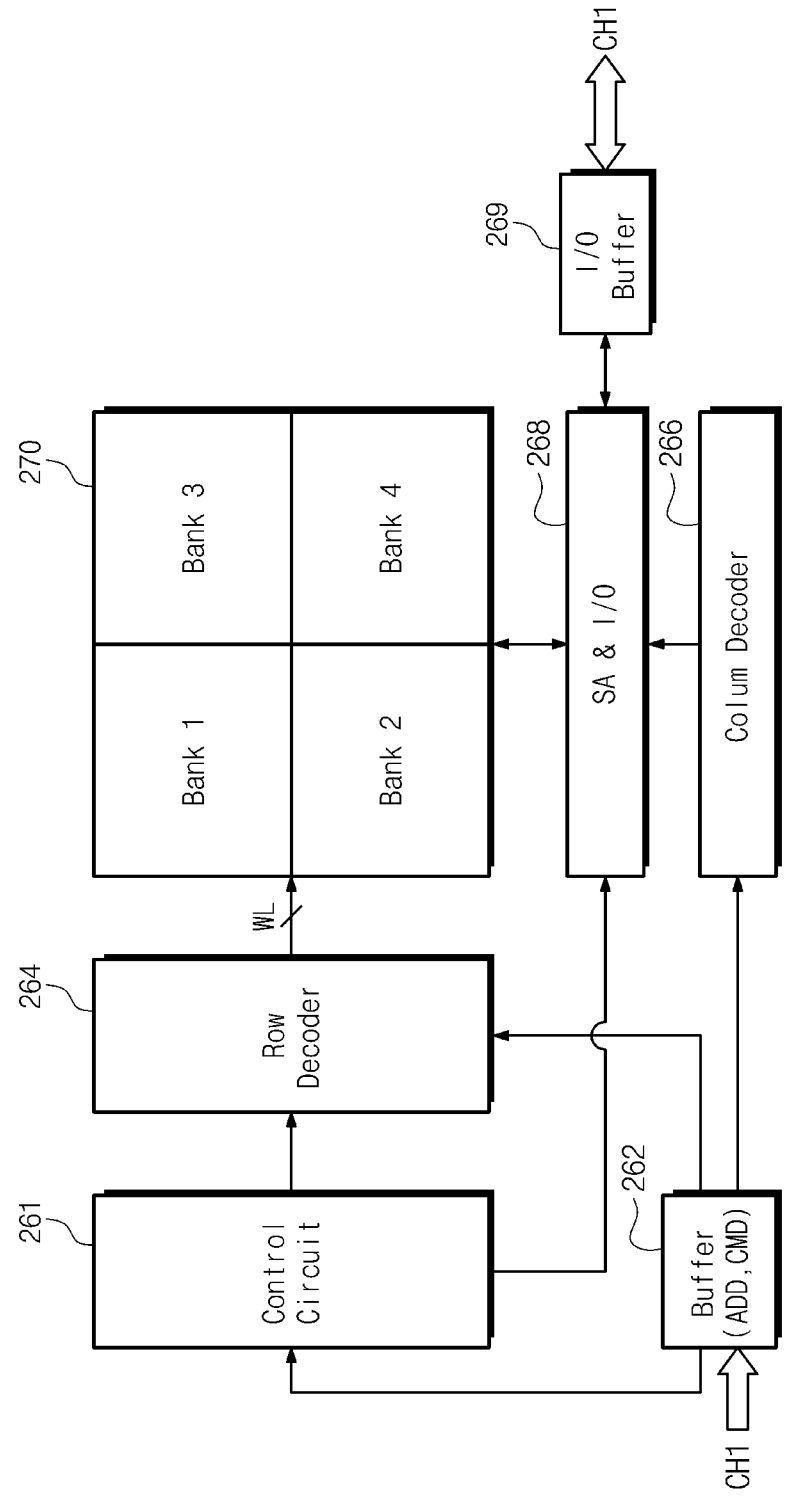
FIG. 16 is an exemplary block diagram illustrating a configuration of one of the chips of FIG. 15.

FIG. 16 is an exemplary block diagram illustrating a configuration of one of the chips of FIG. 15. For example, a circuit block configuration of a first chip 251 is shown in FIG. 16.

The first chip 251 may include a memory cell array 270, a sense amplifier and input/output circuit (SA & I/O) 268, an input/output (I/O) buffer 269, a buffer 262, a row decoder 264, a column decoder 266, and a control circuit 261.

The memory cell array 270 may include DRAM memory cells each including a single access transistor and a single storage capacitor. The memory cells may be arranged in a matrix of rows and columns. Although the memory cell array 270 is divided into four banks, it is merely exemplary and the memory cell array 270 may be designed with one or more banks.

The control circuit 261 receives an applied control signal and an applied address to generate an internal control signal to control set operation modes.

The buffer 262 receives the applied address to perform buffering. In response to the internal control signal, the buffer 262 provides a row address to select a row of the memory cell array 270 to the row decoder 264 and provides a column address to select a column of the memory cell array 270 to the column decoder 266.

The buffer 262 receives an applied command to perform buffering. The command is applied to the control circuit 261 to be decoded.

The row decoder 264 decodes the row address in response to the internal control signal. When a result of the row address decoding is applied to the memory cell array 270, a selected one of wordlines connected to memory cells is driven.

The column decoder 266 decodes the column address in response to the internal control signal. Column gating is performed according to the decoded column address. As a result of performing the column gating, a selected one of bitlines connected to memory cells is driven.

The sense amplifier and input/output circuit (SA & I/O) 268 detects a potential appearing on a bitline of a selected memory cell to sense data stored in the selected memory cell.

The I/O buffer 269 buffers input/output data. In a read operation mode, the I/O buffer 269 buffers data read out from the sense amplifier and input/output circuit (SA & I/O) 268 after outputting the read-out data to a channel CH1.

As described above, defective memory cells of a semiconductor memory device are repaired by spare memory cells in a user level.

While the present disclosure has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the inventive concept as defined by the following claims.

What is claimed is:

1. A method for repairing one or more defective memory cells of a semiconductor memory device included in a system, the method comprising:
    checking whether an error has occurred in data read from the semiconductor memory device when the system is booted;
    generating a system management interrupt (SMI) to invoke a basic input/output system (BIOS) service routine when the error has occurred in the read data;
    checking and storing defective cell information corresponding to the one or more defective memory cells causing a read error in the semiconductor memory device during an execution of the BIOS service routine;
    reading the defective cell information during a power-on self test (POST) of the BIOS when the system is rebooted; and
    after the system is rebooted, performing a repair operation to repair the one or more defective memory cells using one or more spare memory cells of the semiconductor memory device, based on the defective cell information, before an operating system (OS) of the system is loaded.

2. The method as set forth in claim 1, wherein checking whether the error has occurred is performed based on a result from an operation of an error correction code (ECC) engine.

3. The method as set forth in claim 1, wherein the defective cell information is stored in at least one of a register, a basic input/output system (BIOS) memory, and a complementary metal-oxide semiconductor (CMOS) memory.

4. The method as set forth in claim 1, further comprising:
    after performing the repair operation, exiting the POST and executing the OS.

5. The method as set forth in claim 1, wherein the BIOS service routine is executed according to a program stored in a basic input/output system (BIOS) memory.

6. A repair method for a memory included in a system, the method comprising:
    generating a system management interrupt (SMI) by a controller, when an error of the memory has occurred during an execution of an operating system (OS) for the system;
    entering a basic input/output system (BIOS) service routine in response to the SMI indicating that the error has occurred; and
    performing a repair operation to repair the error of the memory when the BIOS service routine is executed,
    wherein performing the repair operation comprises:
    storing error information corresponding to the error of the memory when the BIOS service routine is executed;
    exiting the BIOS service routine after storing the error information; and
    reading the stored error information and replacing one or more memory cells of the memory with one or more spare memory cells based on the error information when the BIOS service routine is executed after rebooting the system.

7. The method of claim 6, wherein the error relates to one or more addresses, the one or more addresses corresponding to a single bit error, one or more defective rows, or one or more defective columns of the memory.

8. The method of claim 6, further comprising:
    after performing the repair operation, exiting the BIOS service routine and then executing the OS.

* * * * *